United States Patent
Camacho et al.

(10) Patent No.: US 9,006,031 B2
(45) Date of Patent: Apr. 14, 2015

(54) SEMICONDUCTOR DEVICE AND METHOD OF FORMING EWLB PACKAGE WITH STANDOFF CONDUCTIVE LAYER OVER ENCAPSULANT BUMPS

(75) Inventors: Zigmund R. Camacho, Singapore (SG); Henry D. Bathan, Singapore (SG); Emmanuel A. Espiritu, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 561 days.

(21) Appl. No.: 13/167,133

(22) Filed: Jun. 23, 2011

(65) Prior Publication Data

US 2012/0326337 A1    Dec. 27, 2012

(51) Int. Cl.
| | | |
|---|---|---|
| *H01L 29/36* | (2006.01) | |
| *H01L 29/74* | (2006.01) | |
| *H01L 21/56* | (2006.01) | |
| *H01L 23/00* | (2006.01) | |
| *H01L 25/10* | (2006.01) | |

(52) U.S. Cl.
CPC .............. *H01L 24/96* (2013.01); *H01L 21/561* (2013.01); *H01L 21/568* (2013.01); *H01L 24/19* (2013.01); *H01L 24/20* (2013.01); *H01L 24/97* (2013.01); *H01L 25/105* (2013.01); *H01L 2224/04105* (2013.01); *H01L 2224/19* (2013.01); *H01L 2224/96* (2013.01); *H01L 2224/97* (2013.01); *H01L 2225/1035* (2013.01); *H01L 2924/00* (2013.01); *H01L 2924/01029* (2013.01); *H01L 2924/01322* (2013.01); *H01L 2924/014* (2013.01); *H01L 2924/07802* (2013.01); *H01L 2924/12041* (2013.01); *H01L 2924/1306* (2013.01); *H01L 2924/13091* (2013.01)

(58) Field of Classification Search
USPC .................. 438/107, 109, 110; 257/E25.012, 257/E25.013
See application file for complete search history.

(56) References Cited

U.S. PATENT DOCUMENTS

| | | | | |
|---|---|---|---|---|
| 6,072,239 | A | * | 6/2000 | Yoneda et al. ................. 257/730 |
| 6,573,121 | B2 | | 6/2003 | Yoneda et al. |
| 6,815,254 | B2 | * | 11/2004 | Mistry et al. .................. 438/108 |
| 7,473,586 | B1 | | 1/2009 | Lo et al. |
| 2007/0108605 | A1 | | 5/2007 | Yoon et al. |
| 2009/0085186 | A1 | | 4/2009 | Meyer |
| 2009/0289356 | A1 | | 11/2009 | Camacho et al. |

* cited by examiner

*Primary Examiner* — Hung Vu
(74) *Attorney, Agent, or Firm* — Robert D. Atkins; Patent Law Group: Atkins and Associates, P.C.

(57) ABSTRACT

A semiconductor device has a carrier with a die attach area. Recesses are formed partially through the carrier outside the die attach area. A first conductive layer is conformally applied over a surface of the carrier and into the recesses. A semiconductor die is mounted to the die attach area of the carrier. An encapsulant is deposited over the carrier and semiconductor die. The encapsulant extends into the recesses over the first conductive layer to form encapsulant bumps. The carrier is removed to expose the first conductive layer over the encapsulant bumps. A first insulating layer is formed over the semiconductor die with openings to expose contact pads of the semiconductor die. A second conductive layer is formed between the first conductive layer and the contact pads on the semiconductor die. A second insulating layer is formed over the second conductive layer and semiconductor die.

24 Claims, 18 Drawing Sheets

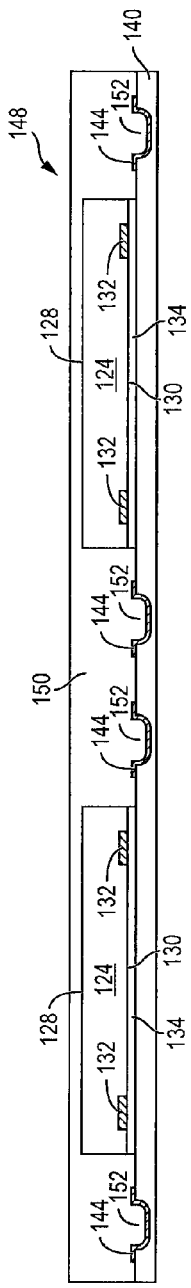
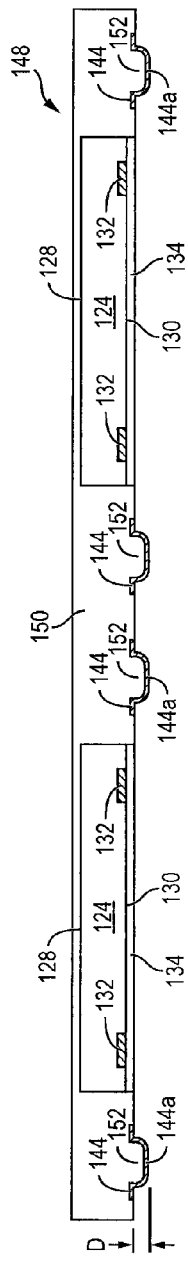
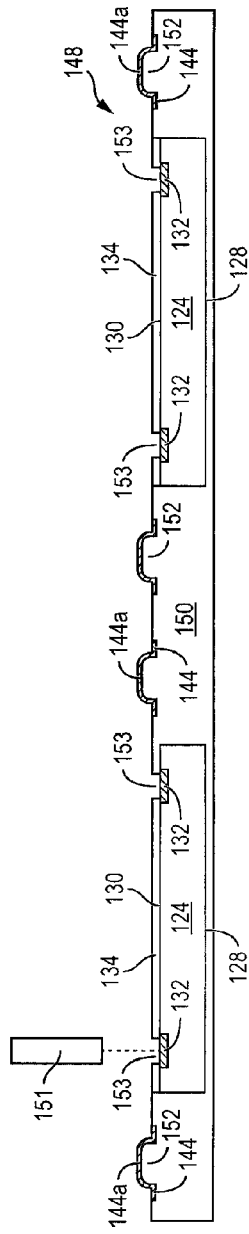
FIG. 4e
FIG. 4f
FIG. 4g

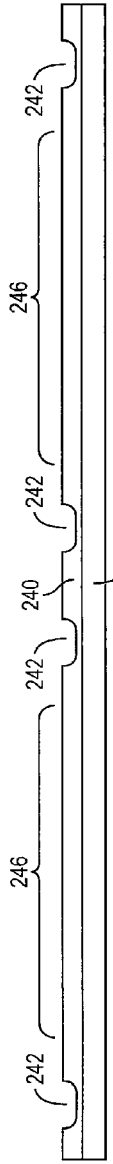
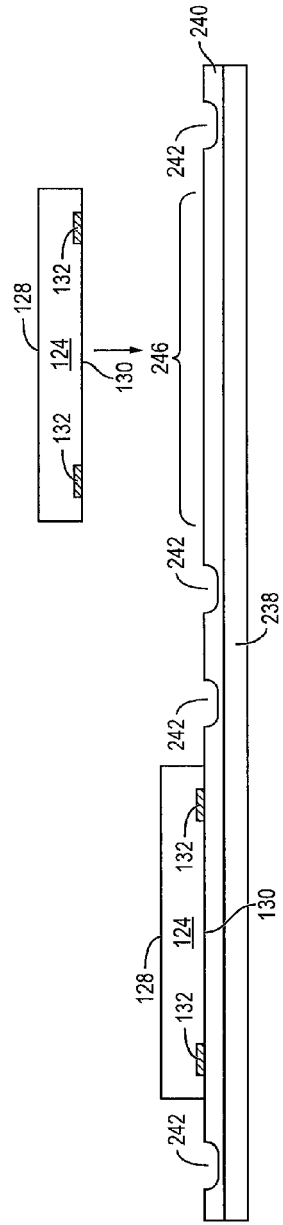
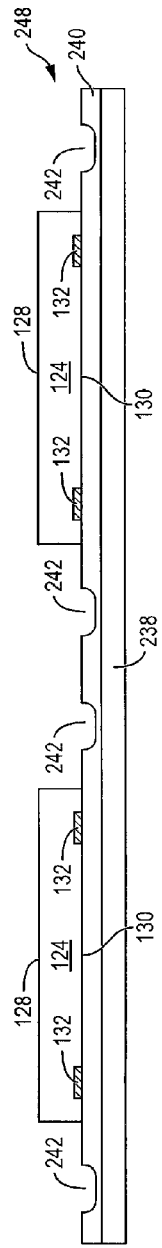
FIG. 10a
FIG. 10b
FIG. 10c
FIG. 10d

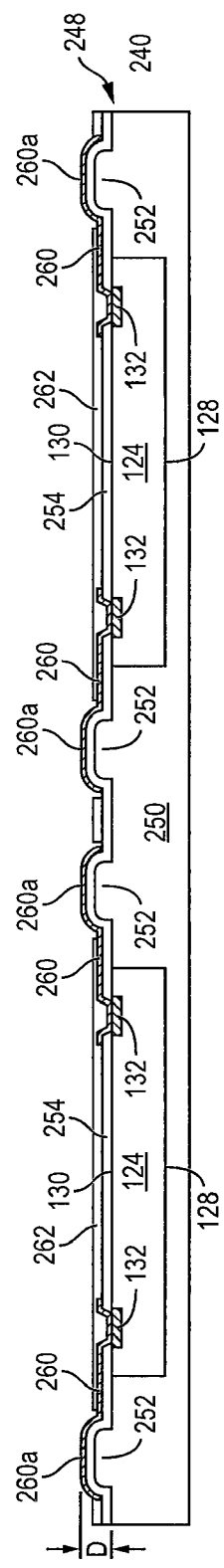
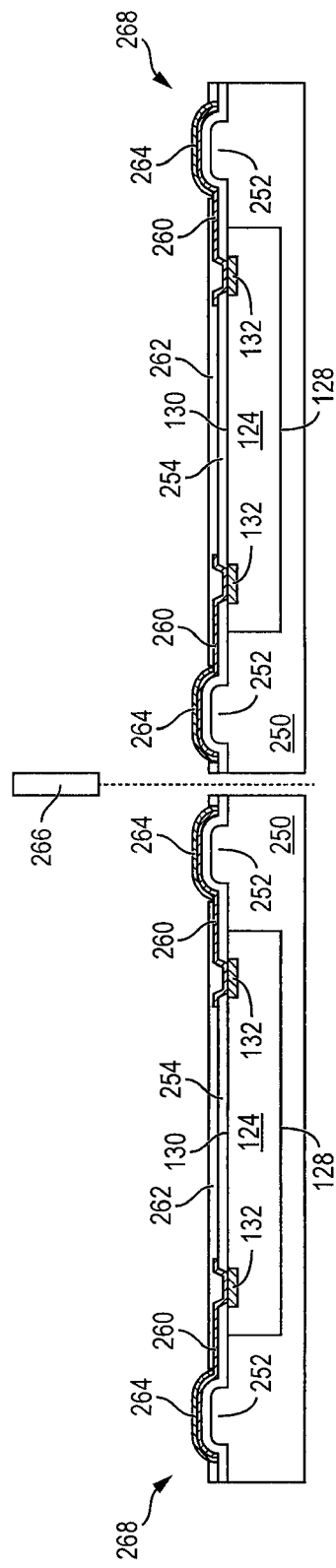
FIG. 10i
FIG. 10j

SEMICONDUCTOR DEVICE AND METHOD OF FORMING EWLB PACKAGE WITH STANDOFF CONDUCTIVE LAYER OVER ENCAPSULANT BUMPS

FIELD OF THE INVENTION

The present invention relates in general to semiconductor devices and, more particularly, to a semiconductor device and method of forming an eWLB semiconductor package with a standoff conductive layer over an encapsulant or adhesive material bump.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Semiconductor die are commonly mounted to a substrate or PCB with interconnect bumps. Semiconductor die can also be stacked and electrically interconnected with bumps. The formation of bumps to electrically interconnect semiconductor die and substrates requires additional processing steps and is subject to cracking, debonding, and bridging which causes defects, lowers manufacturing yield, and increases cost.

SUMMARY OF THE INVENTION

A need exists to mount a semiconductor die to a substrate, or stack semiconductor die, without forming interconnect bumps. Accordingly, in one embodiment, the present invention is a method of making a semiconductor device comprising the steps of providing a carrier having a die attach area, forming a plurality of recesses partially through the carrier outside the die attach area, conformally applying a first conductive layer over a surface of the carrier and into the recesses, mounting a semiconductor die to the die attach area of the carrier, and depositing an encapsulant over the carrier and semiconductor die. The encapsulant extends into the recesses over the first conductive layer to form encapsulant bumps. The method further includes the steps of removing the carrier to expose the first conductive layer over the encapsulant bumps, forming a second conductive layer between the first conductive layer and contact pads on the semiconductor die, and forming a first insulating layer over the second conductive layer and semiconductor die.

In another embodiment, the present invention is a method of making a semiconductor device comprising the steps of providing a carrier, forming a plurality of recesses partially through the carrier, forming a first conductive layer over a surface of the carrier and into the recesses, mounting a semiconductor die to the carrier, and depositing an encapsulant over the carrier and semiconductor die. The encapsulant extends into the recesses over the first conductive layer. The method further includes the steps of removing the carrier to expose the first conductive layer, and forming a second conductive layer between the first conductive layer and contact pads on the semiconductor die.

In another embodiment, the present invention is a method of making a semiconductor device comprising the steps of providing a semiconductor die, and depositing an encapsulant over the semiconductor die. The encapsulant includes encapsulant bumps offset with respect to a surface of the semiconductor die. The method further includes the step of forming a first conductive layer over the encapsulant bumps.

In another embodiment, the present invention is a semiconductor device comprising a semiconductor die and encapsulant deposited over the semiconductor die. The encapsulant includes encapsulant bumps. A first conductive layer is formed over the encapsulant bumps. A first insulating layer is formed over the first conductive layer and semiconductor die.

BRIEF DESCRIPTION OF THE DRAWINGS

FIGS. 4a-4i illustrate a process of forming an eWLB semiconductor package with a standoff conductive layer over an encapsulant bump;

FIGS. 10a-10j illustrate another process of forming an eWLB semiconductor package with a standoff conductive layer over an encapsulant bump;

DETAILED DESCRIPTION OF THE DRAWINGS

Figure 1:
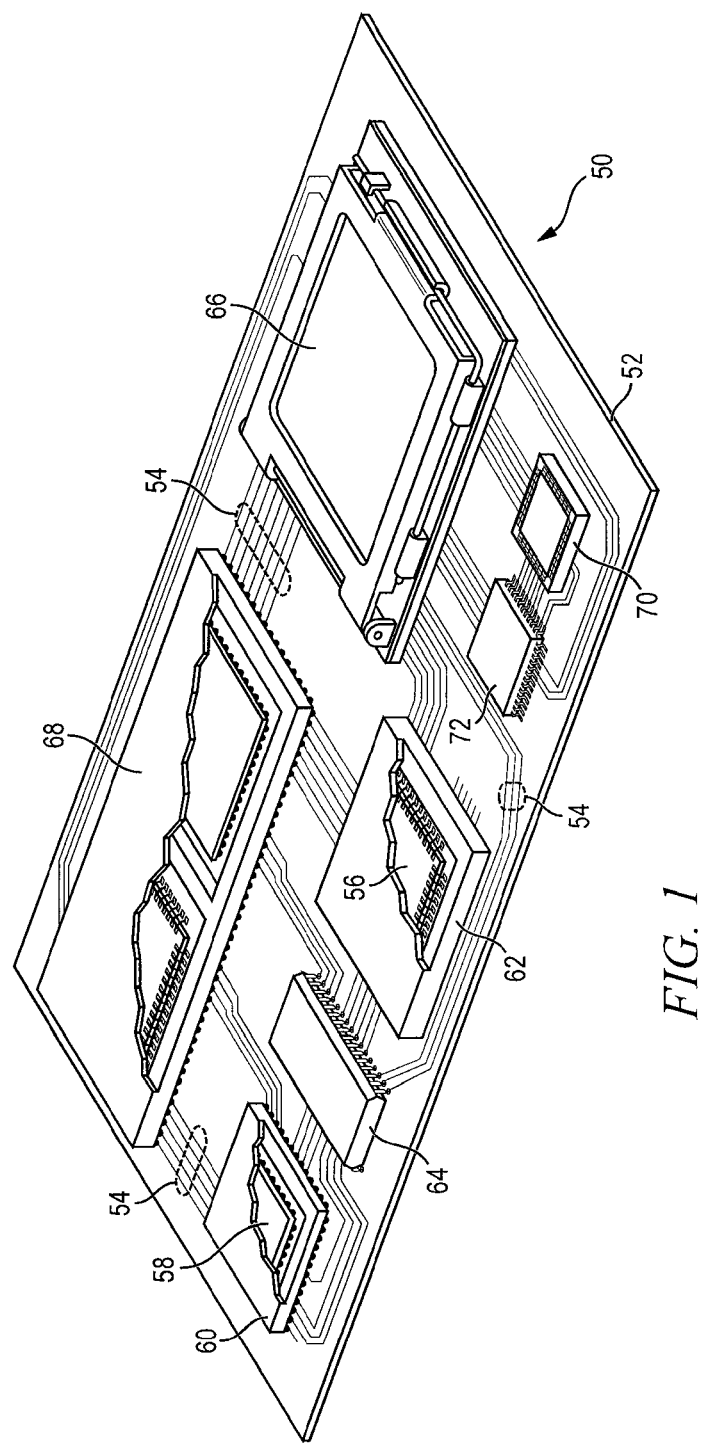
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
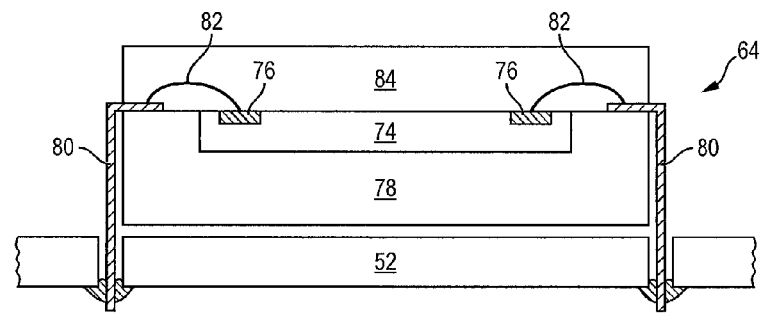
FIGS. 2a-2c illustrate further detail of the representative semiconductor packages mounted to the PCB.
Figure 2B:
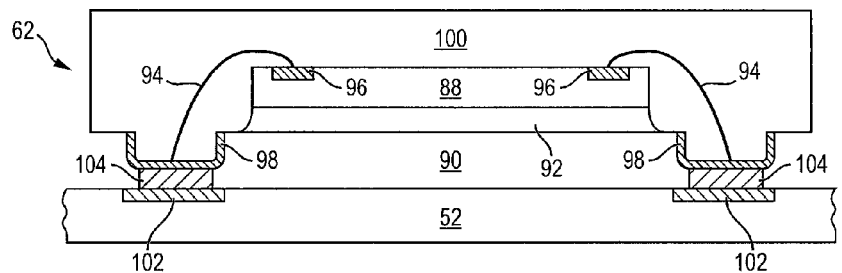
Figure 2C:
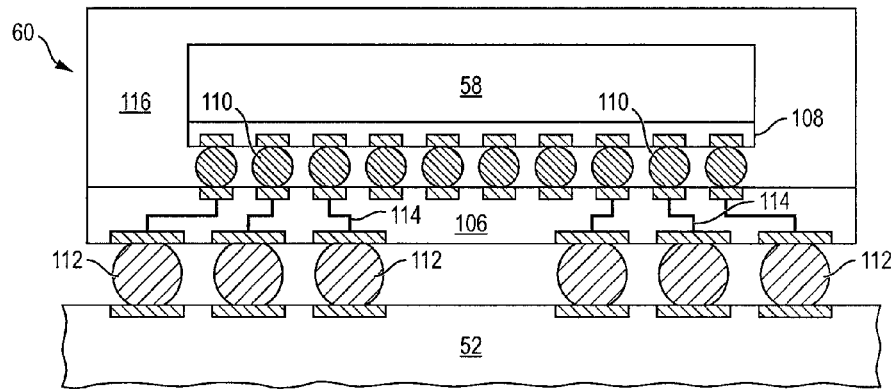

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted to carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
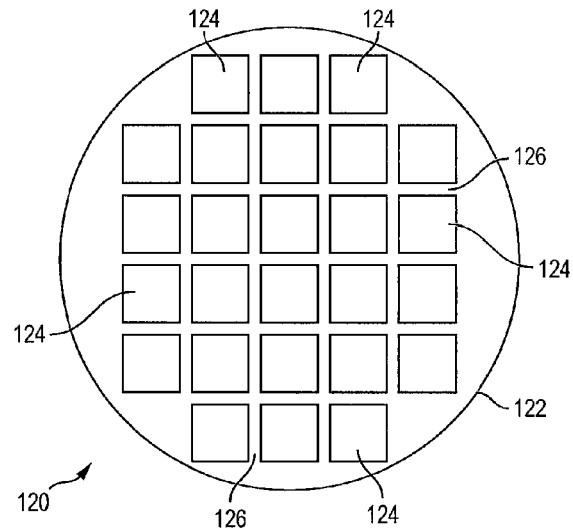
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
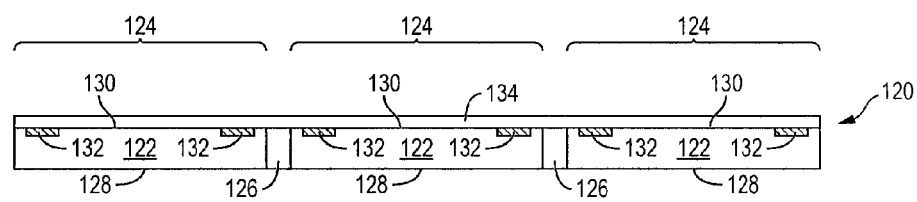

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flip chip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

A non-conductive adhesive layer 134 is formed over active surface 130 and conductive layer 132. Adhesive material 134 can be an epoxy resin containing butadiene-acrylonitrile rubber with a carboxyl group as a fluxing agent, acid anhydride curing agent, and curing accelerator. Suitable epoxy resins include epoxy resin of bisphenol-A, epoxy resin of bisphenol-F, epoxy resin of phenol novolak, epoxy resin of bisphenol AD, epoxy resin of biphenyl, epoxy resin of naphthalene, alicyclic epoxy resin, epoxy resin of glycidyl ester, epoxy resin of glycidyl amine, heterocyclic epoxy resin, epoxy resin of diallyl sulfone, and epoxy resin of hydroquinone. Adhesive layer 134 has a smooth, flat planar surface to aid with later formation of conductive layers.

In another embodiment, layer 134 is an insulating or dielectric material formed using PVD, CVD, printing, spin coating, spray coating, sintering or thermal oxidation. The insulating layer 134 contains one or more layers of SiO2, Si3N4, SiON, Ta2O5, Al2O3, benzocyclobutene (BCB), polyimide (PI), polybenzoxazoles (PBO), or other suitable dielectric material.

Figure 3C:
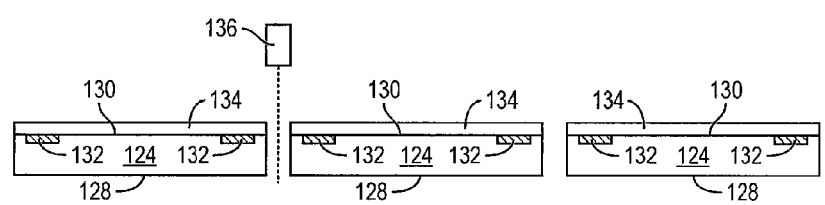

In FIG. 3c, semiconductor wafer 120 is singulated through layer 134 and saw street 126 using a saw blade or laser cutting tool 136 into individual semiconductor die 124.

Figure 4A:
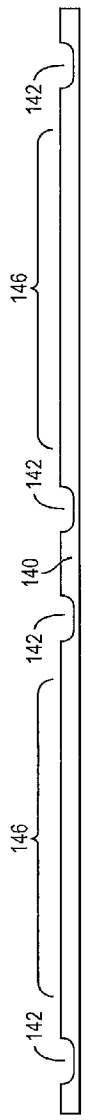

FIGS. 4a-4i illustrate, in relation to FIGS. 1 and 2a-2c, a process of forming an eWLB semiconductor package with a standoff conductive layer over encapsulant bumps. FIG. 4a shows a portion of wafer-form base carrier or substrate 140 made with gold, silver, nickel, platinum, copper, copper alloys (including one or more elements of nickel, iron, zinc, tin, chromium, silver, and phosphorous), or other suitable materials. In one embodiment, carrier 140 is a pre-plated copper carrier made with a thickness of 100-300 micrometers (µm) using leadframe technology. In particular, carrier 140 is formed to have a smooth, flat planar surface and may undergo CMP or other smoothing operation to achieve the smooth, flat planar surface. Alternatively, temporary carrier 140 contains sacrificial base material such as silicon, polymer, beryllium oxide, glass, electromagnetic casting (EMC), or other suitable low-cost, rigid material for structural support.

Carrier 140 is patterned and etched to form a plurality of indentations or recesses 142 outside die attach area 146 on the carrier. Recesses 142 are etched partially but not completely through carrier 140, e.g., the recesses extend more than 50-75% through the carrier. In one embodiment, the depth of recesses 142 is 50-225 µm with respect to a surface of carrier 140. Recesses 142 can be rounded, vertical, or circular.

Figure 4B:
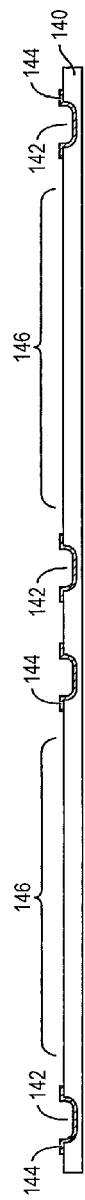

In FIG. 4b, an electrically conductive layer 144 is conformally applied over the partially-etched recesses 142 using a patterning and metal deposition process such as printing, PVD, CVD, sputtering, electrolytic plating, and electroless plating. Conductive layer 144 can be one or more layers of Al, Cu, Sn, Ni, Au, Ag, palladium (Pd), or other suitable electrically conductive material. In one embodiment, conductive layer 144 is plated with multiple layers of TiW or NiPdAu. Conductive layer 144 follows the contour of carrier 140, including into recesses 142.

Figure 4C:
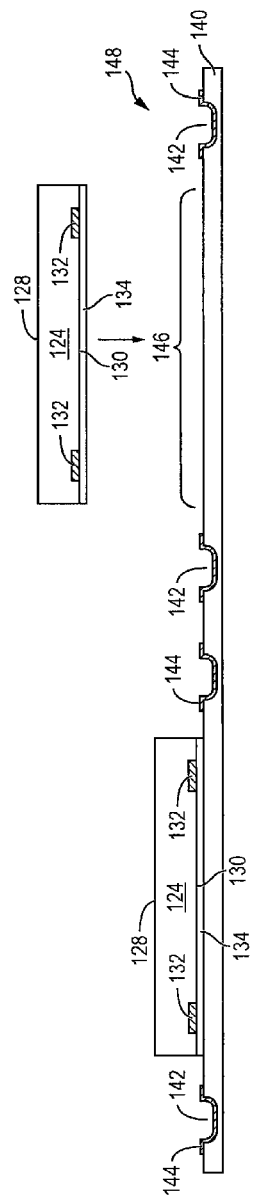
Figure 4D:
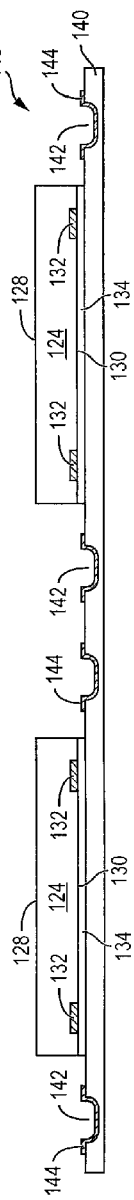

In FIG. 4c, semiconductor die 124 from FIGS. 3a-3c are positioned over carrier 140 and aligned to die attach area 146 with adhesive layer 134 oriented toward the carrier. FIG. 4d shows semiconductor die 124 mounted to die attach area 146 of carrier 140 as a reconstituted or reconfigured semiconductor wafer 148. Adhesive layer 134 temporarily bonds semiconductor die 124 to the surface of carrier 140 in die attach area 146.

In FIG. 4e, an encapsulant or molding compound 150 is deposited over carrier 140 and semiconductor die 124 using a paste printing, compressive molding, transfer molding, liquid encapsulant molding, vacuum lamination, spin coating, or other suitable applicator. In particular, encapsulant 150 is deposited within recesses 142 over conductive layer 144 to form encapsulant bumps 152. Encapsulant 150 can be polymer composite material, such as epoxy resin with filler, epoxy acrylate with filler, or polymer with proper filler. Encapsulant 150 has a smooth, flat planar surface due in part to the smooth, flat planar surface of carrier 140. Encapsulant 150 is non-conductive and environmentally protects the semiconductor device from external elements and contaminants.

In FIG. 4f, carrier 140 is removed by chemical etching, mechanical peeling, CMP, mechanical grinding, thermal bake, UV light, laser scanning, or wet stripping to expose conductive layer 144, adhesive layer 134, and a surface of encapsulant 150. Conductive layer 144, e.g., NiPdAu, is resistant to the etching process and remains intact following removal of carrier 140. The contact surface 144a of conductive layer 144 is vertically offset with respect to active surface 130 of semiconductor die 124, as well as adhesive layer 134, due to the conformal application of the conductive layer 144 within recesses 142 and deposition of encapsulant 150 within recesses 142 to form encapsulant bumps 152. That is, the conformal application of the conductive layer 144 within recesses 142 and deposition of encapsulant 150 within recesses 142, followed by the removal of carrier 140, forms encapsulant bump 152 and causes the contact surface 144a to have a standoff distance D of 50-100 micrometers (µm) with respect to adhesive layer 134 and a standoff distance D plus the thickness of adhesive layer 134 with respect to active surface 130 of semiconductor die 124.

In FIG. 4g, a portion of adhesive layer 134 is removed by laser drilling or mechanical drilling with cutting tool 151 to form openings 153 and expose conductive layer 132 of semiconductor die 124. The openings 153 can also be formed by applying a photoresist layer, masking, and etching process to remove a portion of adhesive layer 134 over conductive layer 132.

Figure 4H:
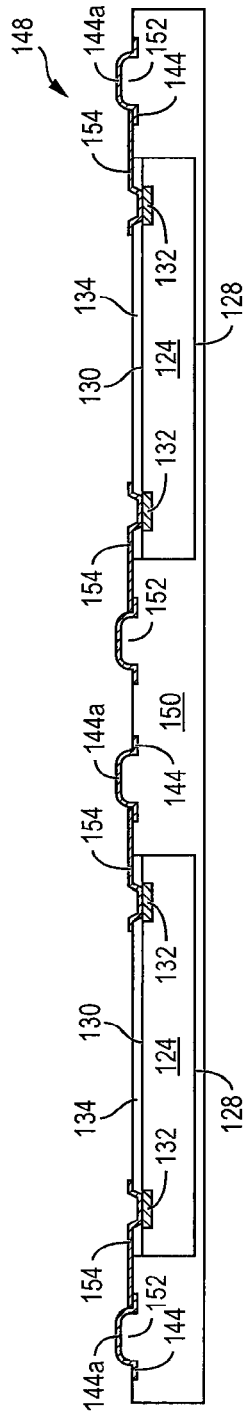

In FIG. 4h, an electrically conductive layer or redistribution layer (RDL) 154 is formed over conductive layer 144, encapsulant 150, and adhesive layer 134 and into openings 153 over conductive layer 132 using a patterning and metal deposition process such as sputtering, electrolytic plating, and electroless plating. Conductive layer 154 can be one or more layers of Al, Cu, Sn, Ni, Au, Ag, or other suitable electrically conductive material. The smooth, flat planar surface of adhesive layer 134, attributed in part to the smooth, flat planar surface of carrier 140, enhances the bonding of conductive layer 154 to adhesive layer 134. In the case of using an insulating material for layer 134, insulating layer 134 exhibits good adhesion for conductive layer 154. One portion of conductive layer 154 is electrically connected between conductive layer 132 of semiconductor die 124 and conductive layer 144. Other portions of conductive layer 154 can be electrically common or electrically isolated depending on the design and function of semiconductor die 124.

Figure 4I:
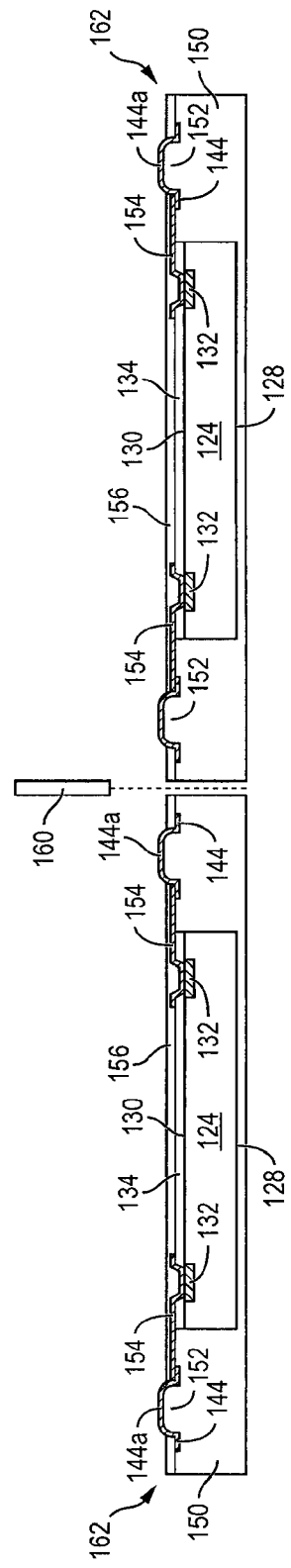

In FIG. 4i, an insulating or passivation layer 156 is formed over adhesive layer 134 and conductive layer 154 for electrical isolation using PVD, CVD, printing, spin coating, spray coating, sintering or thermal oxidation. The insulating layer 156 contains one or more layers of $SiO_2$, $Si_3N_4$, SiON, $Ta_2O_5$, $Al_2O_3$, or other material having similar insulating and structural properties. The thickness of insulating layer 156 is less than the standoff distance D so that contact surface 144a of conductive layer 144 remains exposed from the insulating layer.

Figure 5A:
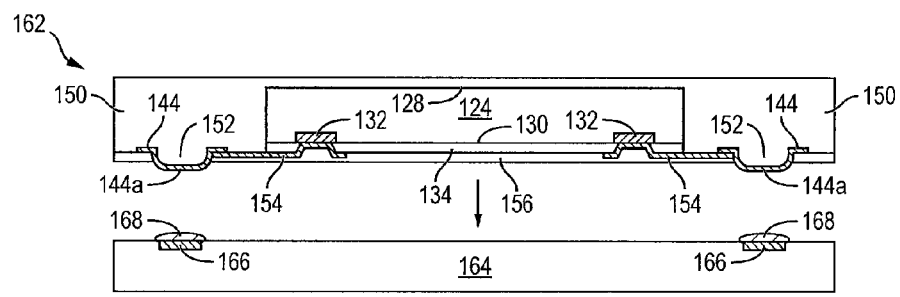
FIGS. 5a-5c illustrate the eWLB semiconductor package with a standoff conductive layer over an encapsulant bump mounted to a substrate.

The reconstituted semiconductor wafer 148 is singulated through encapsulant 150 and insulating layer 156 using a saw blade or laser cutting tool 160 into separate embedded wafer level ball grid array (eWLB) semiconductor packages 162, each containing a semiconductor die 124. FIG. 5a shows eWLB semiconductor package 162 after singulation. Semiconductor die 124 is electrically connected through conductive layer 154 to standoff conductive layer 144. Semiconductor package 162 is positioned over substrate or PCB 164 with the exposed contact surface 144a of standoff conductive layer 144 aligned with conductive traces 166 on the substrate. A conductive paste 168 is deposited over conductive traces 166 intended for bonding to the exposed contact surface 144a of standoff conductive layer 144.

Figure 5B:
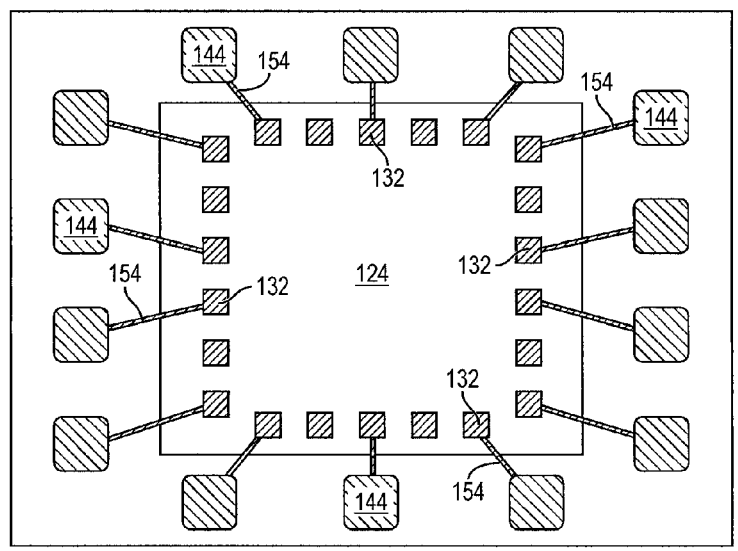

FIG. 5b shows a plan view of eWLB semiconductor package 162 with one portion of conductive layer 154 electrically connected between conductive layer 132 of semiconductor die 124 and conductive layer 144.

Figure 5C:
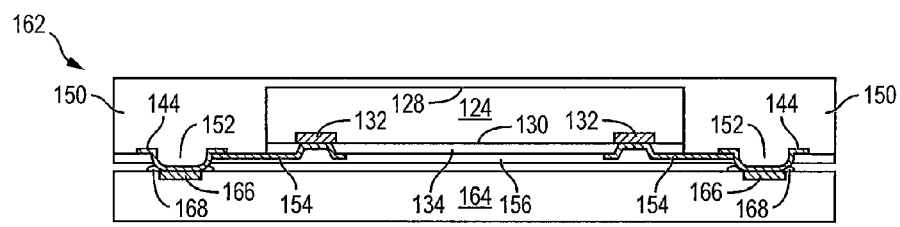

FIG. 5c shows eWLB package 162 mounted to substrate or PCB 164 with contact surface 144a of standoff conductive layer 144 contacting conductive traces 166 on the substrate and bonded with conductive paste 168. The eWLB package 162 has physical separation from substrate 164 by virtue of standoff conductive layer 144 formed over encapsulant bump 152. The physical separation is determined in part by the depth of partially-etched recesses 142 into carrier 140 and correspondingly the height of encapsulant bumps 152. The eWLB package 162 can be simply constructed and electrically connected to substrate 164 notably absent a conventional bump structure as found in the prior art.

Figure 6A:
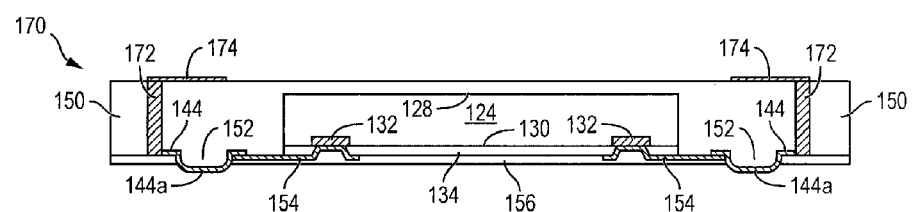
FIGS. 6a-6b illustrate stackable eWLB semiconductor packages with conductive vias electrically connected to the standoff conductive layer.
Figure 6B:
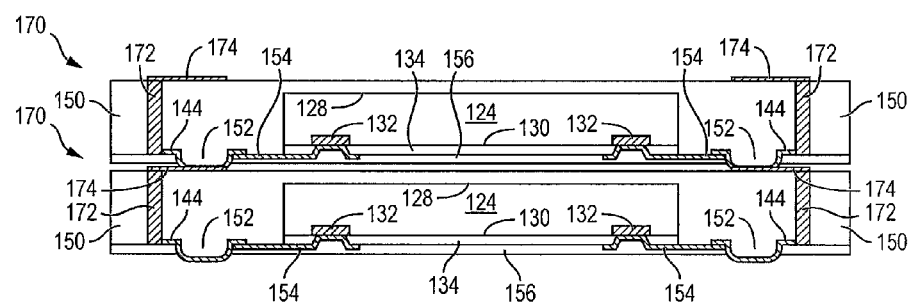

FIGS. 6a-6b illustrate an embodiment of eWLB semiconductor package 170, similar to FIG. 5a, with conductive vias 172 formed through encapsulant 150. A plurality of vias is formed through encapsulant 150 proximate to conductive layer 144 using laser drilling, mechanical drilling, or deep reactive ion etching (DRIE). The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 172. Conductive vias 172 are electrically connected to conductive layer 144.

An electrically conductive layer or RDL 174 is formed over a surface of encapsulant 150 and conductive vias 172, opposite encapsulant bumps 152, using a patterning and metal deposition process such as printing, PVD, CVD, sputtering, electrolytic plating, and electroless plating. Conductive layer 174 can be one or more layers of Al, Cu, Sn, Ni, Au, Ag, or other suitable electrically conductive material. Conductive layer 174 is electrically connected to conductive vias 172.

FIG. 6b shows two stacked eWLB packages 170. The contact surface 144a of standoff conductive layer 144 in the upper eWLB package is bonded to conductive layer 174 of the lower eWLB package. Semiconductor die 124 in each eWLB package 170 is electrically connected through conductive layers 144, 154, and 174 and conductive vias 172. The stacked eWLB packages 170 have physical separation by virtue of standoff conductive layer 144 formed over encapsulant bumps 152. The eWLB packages 170 can be simply constructed for stacking with electrically connection notably absent a bump structure as found in the prior art.

Figure 7A:
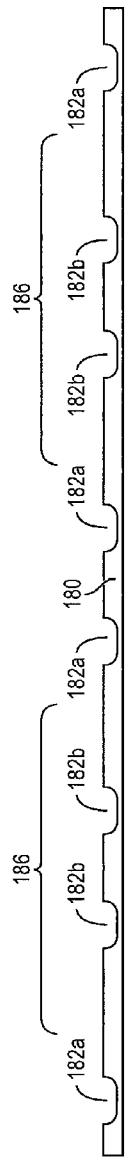
FIGS. 7a-7i illustrate another process of forming an eWLB semiconductor package with a standoff conductive layer over an encapsulant bump and adhesive material bump.

FIGS. 7a-7i illustrate, in relation to FIGS. 1 and 2a-2c, another process of forming an eWLB semiconductor package with a standoff conductive layer over encapsulant bumps and adhesive material bumps. FIG. 7a shows a portion of wafer-form base carrier or substrate 180 made with gold, silver, nickel, platinum, copper, copper alloys (including one or more elements of nickel, iron, zinc, tin, chromium, silver, and phosphorous), or other suitable materials. In one embodiment, carrier 180 is a pre-plated copper carrier made with a thickness of 100-300 μm using leadframe technology. In particular, carrier 180 is formed to have a smooth, flat planar surface and may undergo CMP or other smoothing operation to achieve the smooth, flat planar surface. Alternatively, temporary carrier 180 contains sacrificial base material such as silicon, polymer, beryllium oxide, glass, EMC, or other suitable low-cost, rigid material for structural support.

Carrier 180 is patterned and etched to form a plurality of indentations or recesses 182a outside die attach area 186 and a plurality of indentations or recesses 182b within die attach area 186 on the carrier. Recesses 182a-182b are etched partially but not completely through carrier 180, e.g., the recesses extend more than 50-75% through the carrier. In one embodiment, the depth of recesses 182a-182b is 50-225 μm with respect to a surface of carrier 180. Recesses 182a-182b can be rounded, vertical, or circular.

Figure 7B:
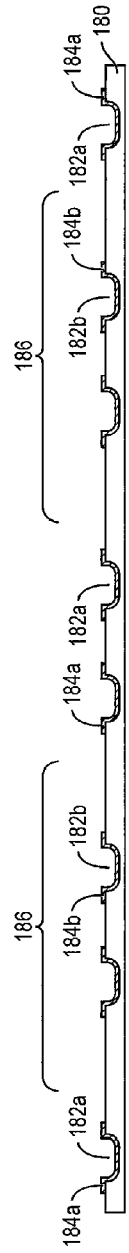

In FIG. 7b, an electrically conductive layer 184 is conformally applied over the partially-etched recesses 182a-182b using a patterning and metal deposition process such as printing, PVD, CVD, sputtering, electrolytic plating, and electroless plating. Conductive layer 184 can be one or more layers of Al, Cu, Sn, Ni, Au, Ag, palladium (Pd), or other suitable electrically conductive material. In one embodiment, conductive layer 184 is plated with multiple layers of NiPdAu. Conductive layer 184 follows the contour of carrier 180, including into recesses 182a-182b.

Figure 7C:
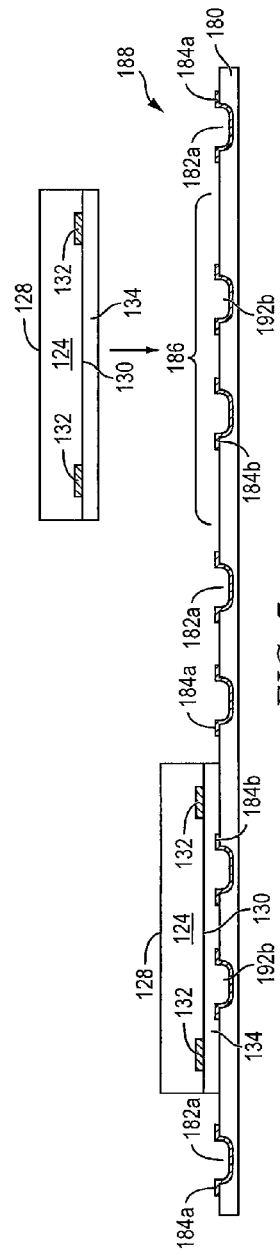
Figure 7D:
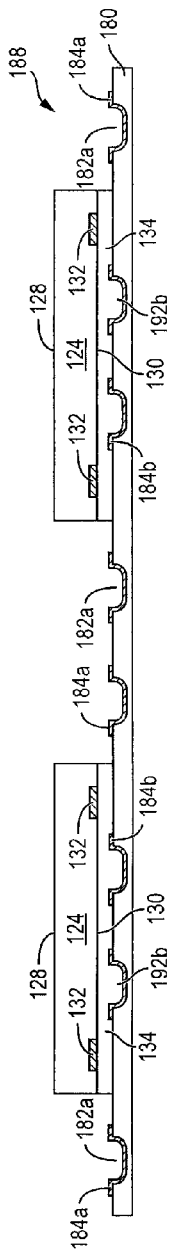

In FIG. 7c, semiconductor die 124 from FIGS. 3a-3c are positioned over carrier 180 and aligned to die attach area 186 with adhesive layer 134 oriented toward the carrier. FIG. 7d shows semiconductor die 124 mounted to die attach area 186 of carrier 180 as a reconstituted or reconfigured semiconductor wafer 188. Adhesive layer 134 temporarily bonds semiconductor die 124 to the surface of carrier 180 in die attach area 186. In this embodiment, adhesive layer 134 fills recesses 182b over conductive layer 184b to form adhesive material bumps 192b.

Figure 7E:
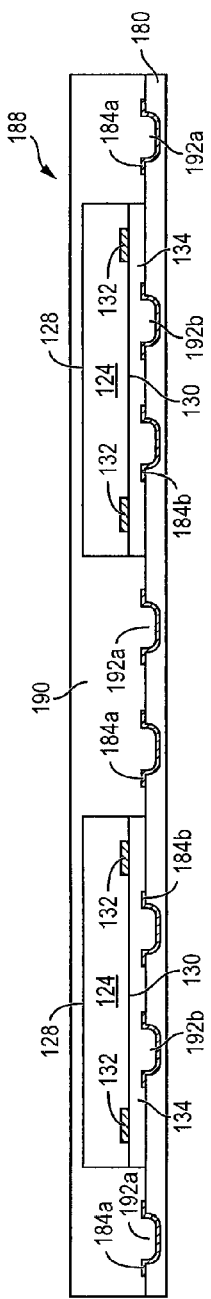

In FIG. 7e, an encapsulant or molding compound 190 is deposited over carrier 180 and semiconductor die 124 using a paste printing, compressive molding, transfer molding, liquid encapsulant molding, vacuum lamination, spin coating, or other suitable applicator. In particular, encapsulant 190 is deposited within recesses 182a over conductive layer 184a to form encapsulant bumps 192a. Encapsulant 190 can be polymer composite material, such as epoxy resin with filler, epoxy acrylate with filler, or polymer with proper filler. Encapsulant 190 has a smooth, flat planar surface due in part to the smooth, flat planar surface of carrier 180. Encapsulant 190 is non-conductive and environmentally protects the semiconductor device from external elements and contaminants.

Figure 7F:
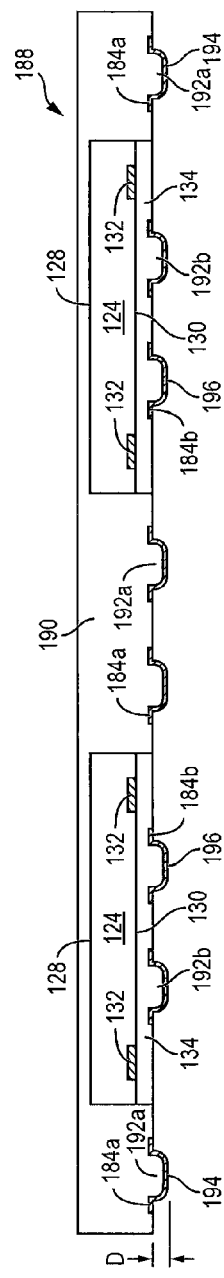

In FIG. 7f, carrier 180 is removed by chemical etching, mechanical peeling, CMP, mechanical grinding, thermal bake, UV light, laser scanning, or wet stripping to expose conductive layer 184a-184b, adhesive layer 134, and a surface of encapsulant 190. Conductive layer 184a-184b, e.g., NiPdAu, is resistant to the etching process and remains intact following removal of carrier 180. The contact surface 194 of conductive layer 184a is vertically offset with respect to active surface 130 of semiconductor die 124, as well as the planar portion of adhesive layer 134, due to the conformal application of the conductive layer 184 within recesses 182a and deposition of encapsulant 190 within recesses 182a to form encapsulant bumps 192a. Likewise, contact surface 196 of conductive layer 184b is vertically offset with respect to active surface 130 of semiconductor die 124, as well as the planar portion of adhesive layer 134, due to the conformal application of the conductive layer 184 within recesses 182b and introduction of adhesive material 134 into recesses 182b to form adhesive material bumps 192b. That is, the conformal application of the conductive layer 184 within recesses 182a-182b and deposition of encapsulant 190 within recesses 182a and introduction of adhesive material 134 within recesses 182b, followed by the removal of carrier 140, forms encapsulant bumps 192a and adhesive material bumps 192b and causes contact surfaces 194 and 196 to have a standoff distance D of 50-100 μm plus the thickness of adhesive layer 134 with respect to active surface 130 of semiconductor die 124.

Figure 7G:
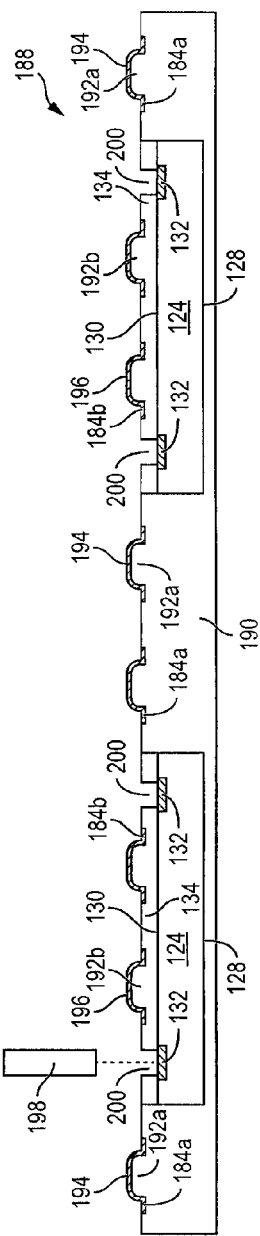

In FIG. 7g, a portion of adhesive layer 134 is removed by laser drilling or mechanical drilling with cutting tool 198 to form openings 200 and expose conductive layer 132 of semiconductor die 124. The openings 200 can also be formed by applying a photoresist layer, masking, and etching process to remove a portion of adhesive layer 134 over conductive layer 132.

Figure 7H:
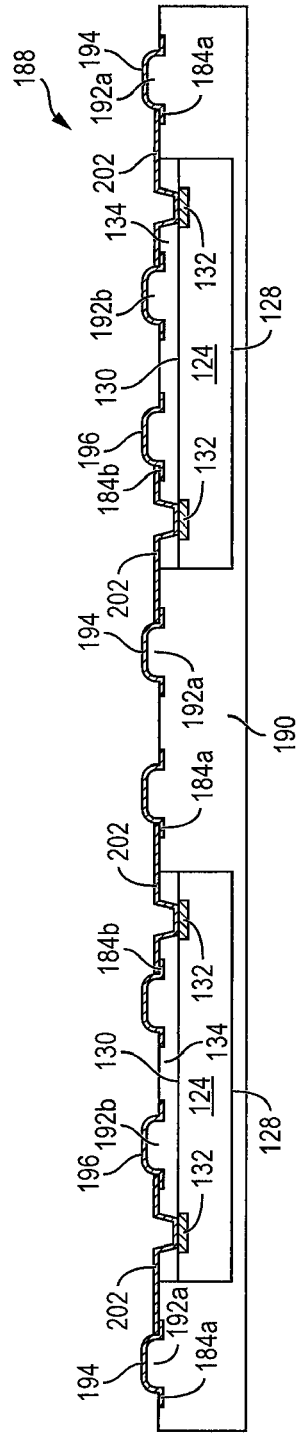

In FIG. 7h, an electrically conductive layer or redistribution layer (RDL) 202 is formed over conductive layer 184a-184b, encapsulant 190, and adhesive layer 134 and into openings 200 over conductive layer 132 using a patterning and metal deposition process such as sputtering, electrolytic plating, and electroless plating. Conductive layer 202 can be one or more layers of Al, Cu, Sn, Ni, Au, Ag, or other suitable electrically conductive material. The smooth, flat planar surface of adhesive layer 134, attributed in part to the smooth, flat planar surface of carrier 190, enhances the bonding of conductive layer 202 to adhesive layer 134. In the case of using an insulating material for layer 134, insulating layer 134 exhibits good adhesion for conductive layer 202. One portion of conductive layer 202 is electrically connected between conductive layer 132 of semiconductor die 124 and conductive layer 184a. Another portion of conductive layer 202 is electrically connected between conductive layer 132 of semiconductor die 124 and conductive layer 184b. Other portions of conductive layer 202 can be electrically common or electrically isolated depending on the design and function of semiconductor die 124.

Figure 7I:
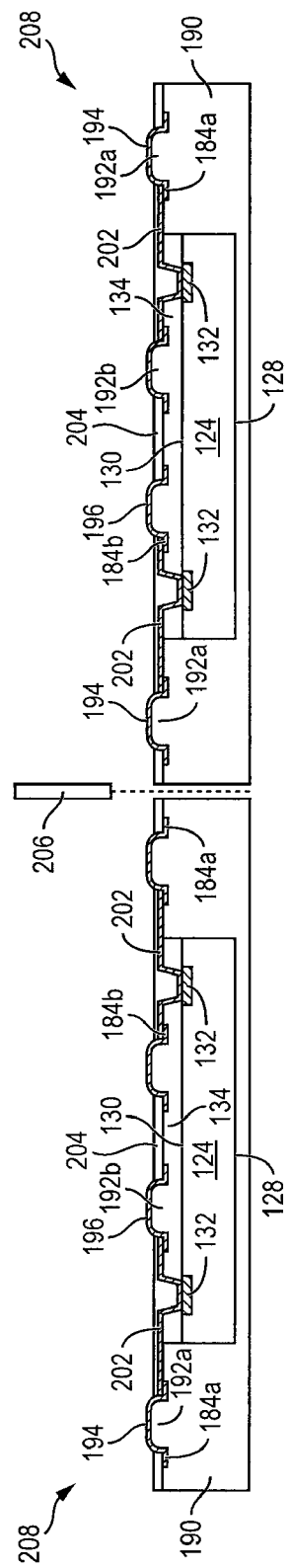

In FIG. 7i, an insulating or passivation layer 204 is formed over adhesive layer 134 and conductive layer 202 for electrical isolation using PVD, CVD, printing, spin coating, spray coating, sintering or thermal oxidation. The insulating layer 204 contains one or more layers of $SiO_2$, $Si_3N_4$, SiON, $Ta_2O_5$, $Al_2O_3$, or other material having similar insulating and structural properties. The thickness of insulating layer 204 is less than the standoff distance D so that contact surfaces 194-196 of conductive layer 184a-184b remain exposed from the insulating layer.

The reconstituted semiconductor wafer 188 is singulated through encapsulant 190 and insulating layer 204 using a saw blade or laser cutting tool 206 into separate eWLB semiconductor packages 208, each containing a semiconductor die 124.

Figure 8A:
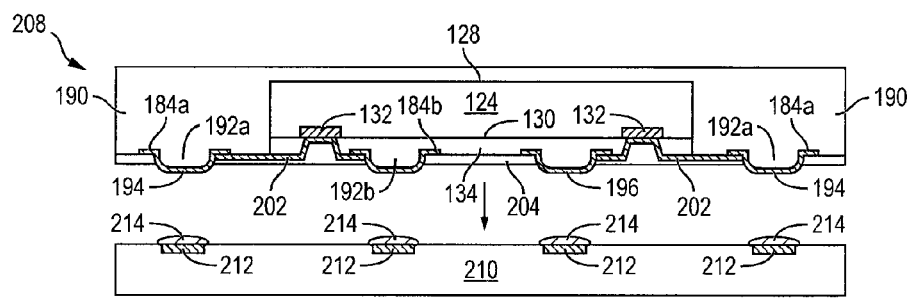
FIGS. 8a-8c illustrate the eWLB semiconductor package with a standoff conductive layer over the encapsulant bump and adhesive material bump mounted to a substrate.

FIG. 8a shows eWLB semiconductor package 208 after singulation. Semiconductor die 124 is electrically connected through conductive layer 202 to standoff conductive layer 184a-184b. Semiconductor package 208 is positioned over substrate or PCB 210 with the exposed contact surface 194 of standoff conductive layer 184a and the exposed contact surface 196 of standoff conductive layer 184b aligned with conductive traces 212 on the substrate. A conductive paste 214 is deposited over conductive traces 212 intended for bonding to the exposed contact surface 194 of standoff conductive layer 184a and the exposed contact surface 196 of standoff conductive layer 184b.

Figure 8B:
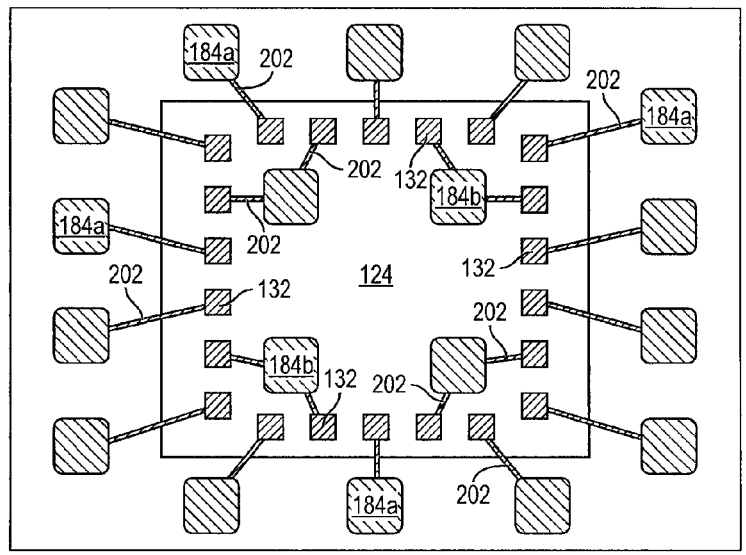

FIG. 8b shows a plan view of eWLB semiconductor package 208 with one portion of conductive layer 202 electrically connected between conductive layer 132 of semiconductor die 124 and conductive layer 184a, and another portion of conductive layer 202 electrically connected between conductive layer 132 of semiconductor die 124 and conductive layer 184b.

Figure 8C:
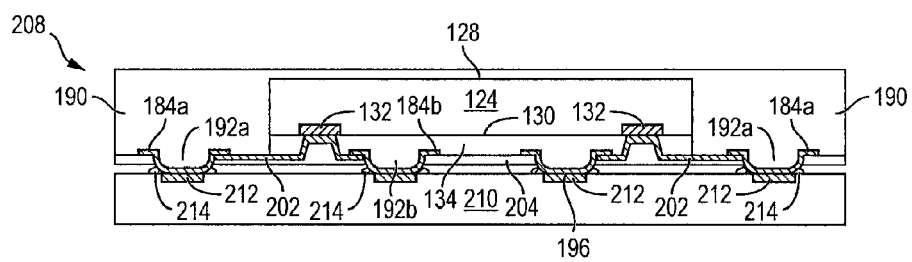

FIG. 8c shows eWLB package 208 mounted to substrate or PCB 210 with contact surface 194 of standoff conductive layer 184a and contact surface 196 of standoff conductive layer 184b contacting conductive traces 212 on the substrate and bonded with conductive paste 214. The eWLB package 208 has physical separation from substrate 210 by virtue of standoff conductive layer 184a-184b formed over encapsulant bumps 192a and adhesive material bumps 192b. The physical separation is determined in part by the depth of partially-etched recesses 182a-182b into carrier 180 and correspondingly the height of encapsulant bumps 192a and adhesive material bumps 192b. The eWLB package 208 can be simply constructed and electrically connected to substrate 210 notably absent a conventional bump structure as found in the prior art.

Figure 9A:
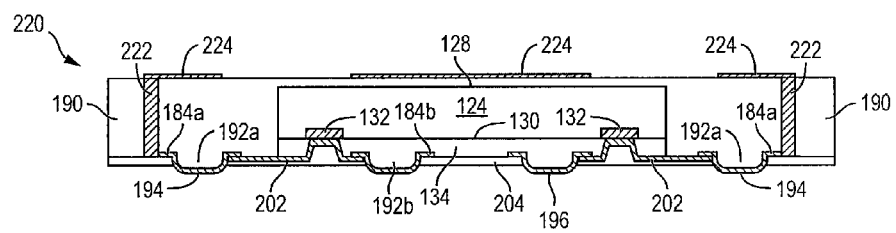
FIGS. 9a-9b illustrate stackable eWLB semiconductor packages with conductive vias electrically connected to the standoff conductive layer.
Figure 9B:
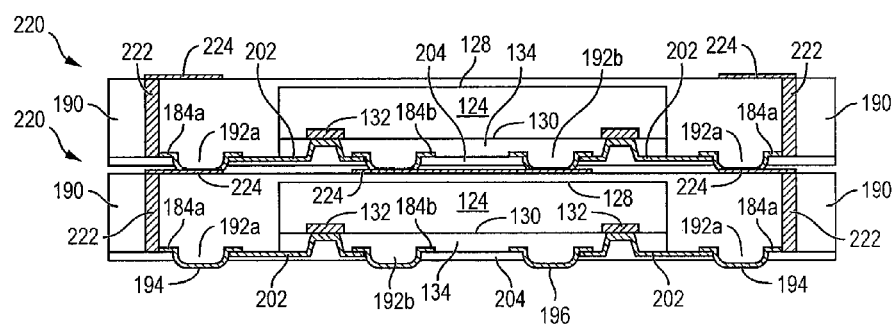

FIGS. 9a-9b illustrate an embodiment of eWLB semiconductor package 220, similar to FIG. 8a, with conductive vias 222 formed through encapsulant 190. A plurality of vias is formed through encapsulant 190 proximate to conductive layer 184a using laser drilling, mechanical drilling, or DRIE. The vias are filled with Al, Cu, Sn, Ni, Au, Ag, Ti, W, polysilicon, or other suitable electrically conductive material using electrolytic plating, electroless plating process, or other suitable metal deposition process to form z-direction vertical interconnect conductive vias 222. Conductive vias 222 are electrically connected to conductive layer 184a.

An electrically conductive layer or RDL 224 is formed over a surface of encapsulant 190 and conductive vias 222, opposite encapsulant bumps 192a and adhesive material bumps 192b, using a patterning and metal deposition process such as printing, PVD, CVD, sputtering, electrolytic plating, and electroless plating. Conductive layer 224 can be one or more layers of Al, Cu, Sn, Ni, Au, Ag, or other suitable electrically conductive material. Conductive layer 224 is electrically connected to conductive vias 222.

FIG. 9b shows two stacked eWLB packages 220. The contact surface 194 of standoff conductive layer 184a and contact surface 196 of standoff conductive layer 184b in the upper eWLB package is bonded to conductive layer 224 of the lower eWLB package. Semiconductor die 124 in each eWLB package 220 is electrically connected through conductive layers 184a-184b, 202, and 224 and conductive vias 222. The stacked eWLB packages 220 have physical separation by virtue of standoff conductive layer 184a-184b formed over encapsulant bumps 192a and adhesive material bumps 192b. The eWLB packages 220 can be simply constructed for stacking with electrically connection notably absent a bump structure as found in the prior art.

Figure 10E:
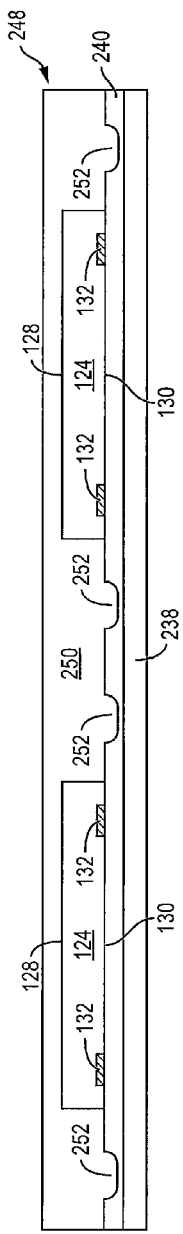

FIGS. 10a-10j illustrate, in relation to FIGS. 1 and 2a-2c, another process of forming an eWLB semiconductor package with a standoff conductive layer over encapsulant bumps. FIG. 10a shows a portion of wafer-form base carrier or substrate 238 made with gold, silver, nickel, platinum, copper, copper alloys (including one or more elements of nickel, iron, zinc, tin, chromium, silver, and phosphorous), or other suitable materials. In one embodiment, carrier 238 is a pre-plated copper carrier made with a thickness of 100-300 μm using leadframe technology. Alternatively, temporary carrier 238 contains sacrificial base material such as silicon, polymer, beryllium oxide, glass, EMC, or other suitable low-cost, rigid material for structural support.

In FIG. 10b, an insulating or passivation layer 240 is formed over carrier 238 using PVD, CVD, printing, spin coating, spray coating, sintering or thermal oxidation. The insulating layer 240 contains one or more layers of SiO2, Si3N4, SiON, Ta2O5, Al2O3, or other material having similar insulating and structural properties. In one embodiment, insulating layer 240 is a thermal releasable tape with a thickness of 25 μm. The insulating layer 240 is patterned and etched to form a plurality of recesses 242 outside die attach area 246 on the insulating layer. Recesses 242 are etched partially but not completely through insulating layer 240, e.g., the recesses extend more than 50-75% through the insulating layer. In one embodiment, the depth of recesses 242 is 50-225 μm with respect to a surface of insulating layer 240. Recesses 242 can be rounded, vertical, or circular.

In FIG. 10c, semiconductor die 124, similar to FIGS. 3a-3c but without adhesive layer 134, are positioned over carrier 238 and aligned to die attach area 246 with active surface 130 oriented toward the carrier. FIG. 10d shows semiconductor die 124 mounted to die attach area 246 of insulating layer 240 as a reconstituted or reconfigured semiconductor wafer 248.

In FIG. 10e, an encapsulant or molding compound 250 is deposited over insulating layer 240 and semiconductor die 124 using a paste printing, compressive molding, transfer molding, liquid encapsulant molding, vacuum lamination, spin coating, or other suitable applicator. In particular, encapsulant 250 is deposited within recesses 242 of insulating layer 240 to form encapsulant bumps 252. Encapsulant 250 can be polymer composite material, such as epoxy resin with filler, epoxy acrylate with filler, or polymer with proper filler. Encapsulant 250 is non-conductive and environmentally protects the semiconductor device from external elements and contaminants.

Figure 10F:
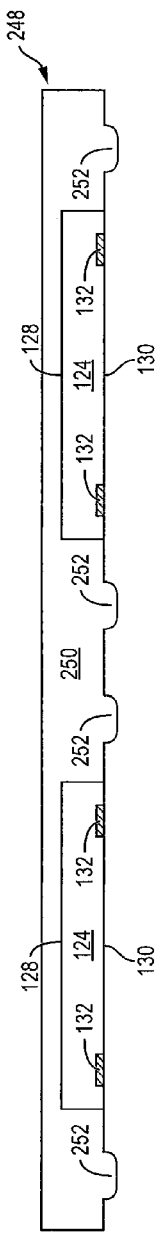

In FIG. 10f, carrier 238 and insulating layer 240 are removed by chemical etching, mechanical peeling, CMP, mechanical grinding, thermal bake, UV light, laser scanning, or wet stripping to expose active surface 130 and conductive layer 132 of semiconductor die 124 and encapsulant 250, including encapsulant bumps 252.

Figure 10G:
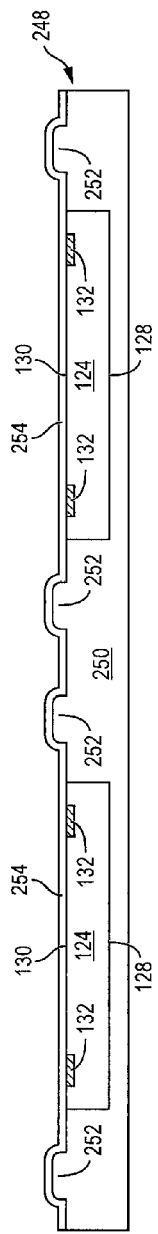

In FIG. 10g, an insulating or passivation layer 254 is conformally applied over active surface 130 and conductive layer 132 of semiconductor die 124 and encapsulant 250, including encapsulant bumps 252, using PVD, CVD, printing, spin coating, spray coating, sintering or thermal oxidation. The insulating layer 254 contains one or more layers of SiO2, Si3N4, SiON, Ta2O5, Al2O3, or other material having similar insulating and structural properties.

Figure 10H:
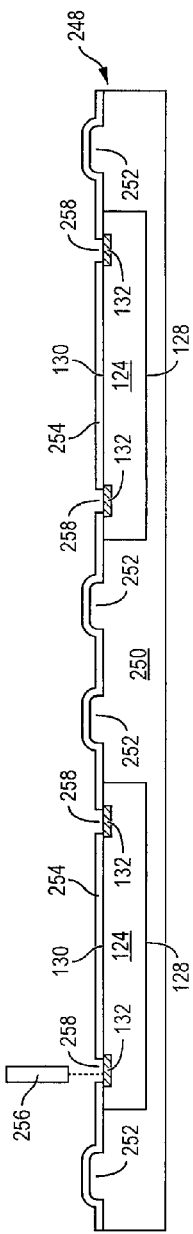

In FIG. 10h, a portion of insulating layer 254 is removed by laser drilling or mechanical drilling with cutting tool 256 to form openings 258 and expose conductive layer 132 of semiconductor die 124. The openings 258 can also be formed by applying a photoresist layer, masking, and etching process to remove a portion of insulating layer 254 over conductive layer 132.

In FIG. 10i, an electrically conductive layer or RDL 260 is conformally applied over insulating layer 254, including into opening 258 over conductive layer 132, using a patterning and metal deposition process such as printing, PVD, CVD, sputtering, electrolytic plating, and electroless plating. Conductive layer 260 can be one or more layers of Al, Cu, Sn, Ni, Au, Ag, Pd, or other suitable electrically conductive material. Conductive layer 260 follows the contour of insulating layer 254, including over encapsulant bumps 252. One portion of conductive layer 260 is electrically connected to conductive layer 132 of semiconductor die 124. Other portions of conductive layer 260 can be electrically common or electrically isolated depending on the design and function of semiconductor die 124.

The contact surface 260a of conductive layer 260 is vertically offset with respect to active surface 130 of semiconductor die 124 due to the conformal application of the conductive layer 260 over encapsulant bumps 252. The contact surface 260a has a standoff distance D of 50-100 μm with respect to active surface 130 of semiconductor die 124.

An insulating or passivation layer 262 is formed over insulating layer 254 and a portion of conductive layer 260 for electrical isolation using PVD, CVD, printing, spin coating, spray coating, sintering or thermal oxidation. The insulating layer 262 contains one or more layers of SiO2, Si3N4, SiON, Ta2O5, Al2O3, or other material having similar insulating and structural properties. The thickness of insulating layer 262 is less than the standoff distance D so that contact surface 260a of conductive layer 260 remains exposed from the insulating layer.

In FIG. 10j, an electrically conductive layer 264 is conformally applied over the portion of conductive layer 260 over encapsulant bumps 252 using a patterning and metal deposition process such as printing, PVD, CVD, sputtering, electrolytic plating, and electroless plating. Conductive layer 264 can be one or more layers of Al, Cu, Sn, Ni, Au, Ag, Pd, or other suitable electrically conductive material. Conductive layer 264 follows the contour of insulating layer 260, including over encapsulant bumps 252. In one embodiment, conductive layer 264 is a UBM layer plated with multiple layers of TiW or NiPdAu.

Figure 11A:
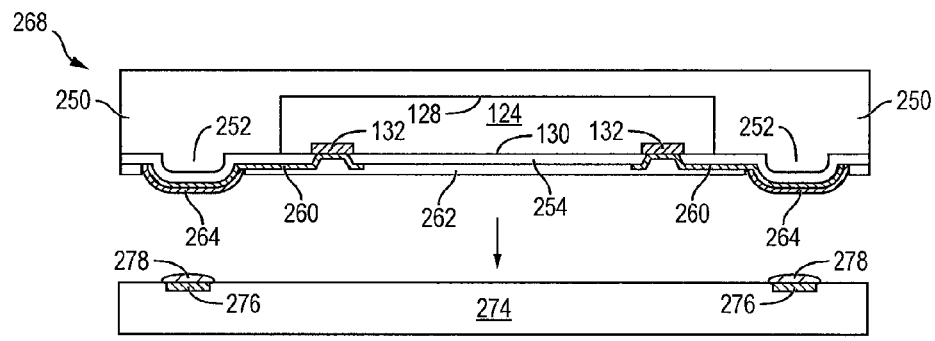
FIGS. 11a-11c illustrate the eWLB semiconductor package with a standoff conductive layer over an encapsulant bump mounted to a substrate.

The reconstituted semiconductor wafer 248 is singulated through encapsulant 250 and insulating layers 254 and 262 using a saw blade or laser cutting tool 266 into separate eWLB semiconductor packages 268, each containing a semiconductor die 124. FIG. 11a shows eWLB semiconductor package 268 after singulation. Semiconductor die 124 is electrically connected to standoff conductive layer 260. Semiconductor package 268 is positioned over substrate or PCB 274 with UBM 264 aligned with conductive traces 276 on the substrate. A conductive paste 278 is deposited over conductive traces 276 intended for bonding to UBM 264 of standoff conductive layer 260.

Figure 11B:
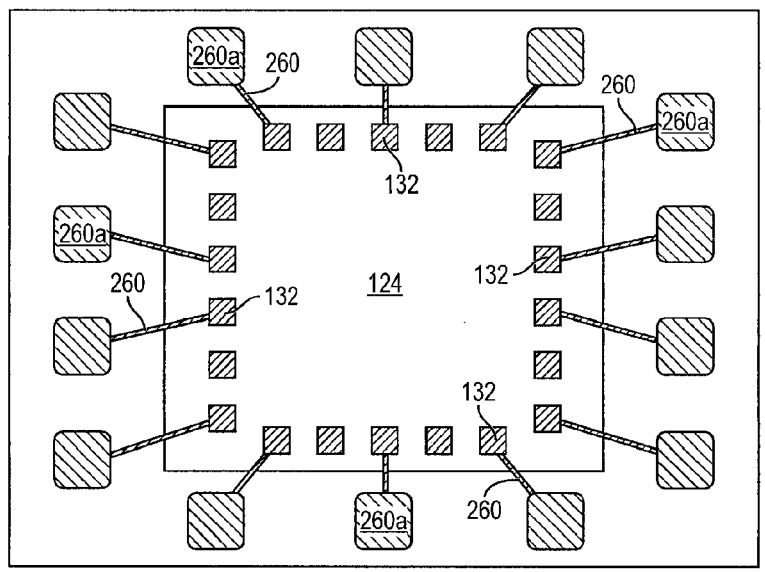

FIG. 11b shows a plan view of eWLB semiconductor package 268 with contact surface 260a and conductive layer 260 electrically connected to conductive layer 132 of semiconductor die 124.

Figure 11C:
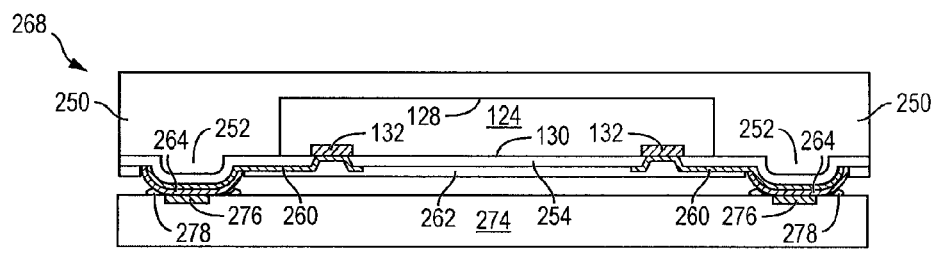

FIG. 11c shows eWLB package 268 mounted to substrate or PCB 274 with UBM 264 of standoff conductive layer 260 contacting conductive traces 276 on the substrate and bonded with conductive paste 278. The eWLB package 268 has physical separation from substrate 274 by virtue of standoff conductive layer 260 formed over encapsulant bump 252. The physical separation is determined in part by the depth of partially-etched recesses 242 into insulating layer 240 and correspondingly the height of encapsulant bumps 252. The eWLB package 268 can be simply constructed and electrically connected to substrate 274 notably absent a conventional bump structure as found in the prior art.

Figure 12A:
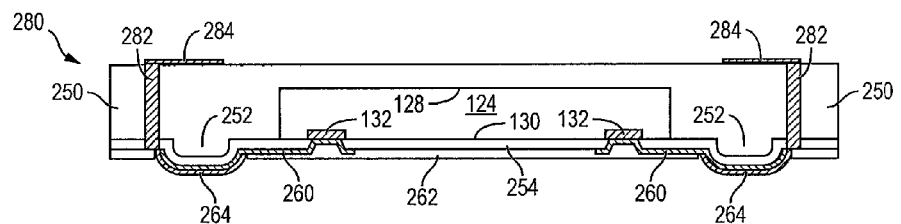
FIGS. 12a-12b illustrate stackable eWLB semiconductor packages with conductive vias electrically connected to the standoff conductive layer.
Figure 12B:
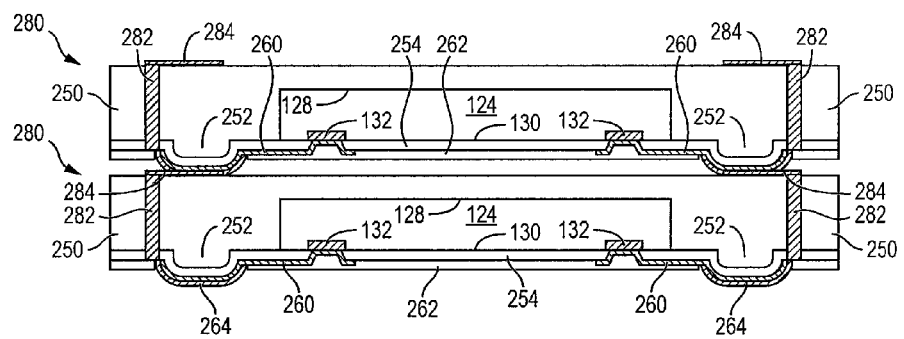

FIGS. 12a-12b illustrate an embodiment of eWLB semiconductor package 280, similar to FIG. 11a, with conductive vias 282 formed through encapsulant 250. A plurality of vias is formed through encapsulant 250 proximate to conductive layer 260a using laser drilling, mechanical drilling, or DRIE. The vias are filled with Al, Cu, Sn, Ni, Au, Ag, Ti, W, polysilicon, or other suitable electrically conductive material using electrolytic plating, electroless plating process, or other suitable metal deposition process to form z-direction vertical interconnect conductive vias 282. Conductive vias 282 are electrically connected to conductive layer 260.

An electrically conductive layer or RDL 284 is formed over a surface of encapsulant 250 and conductive vias 282, opposite encapsulant bumps 252, using a patterning and metal deposition process such as printing, PVD, CVD, sputtering, electrolytic plating, and electroless plating. Conductive layer 284 can be one or more layers of Al, Cu, Sn, Ni, Au, Ag, or other suitable electrically conductive material. Conductive layer 284 is electrically connected to conductive vias 282.

FIG. 12b shows two stacked eWLB packages 280. The UBM 264 of standoff conductive layer 260 in the upper eWLB package is bonded to conductive layer 284 of the lower eWLB package. Semiconductor die 124 in each eWLB package 280 is electrically connected through conductive layers 260 and 284 and conductive vias 282. The stacked eWLB packages 280 have physical separation by virtue of standoff conductive layer 260 formed over encapsulant bumps 252. The eWLB packages 280 can be simply constructed for stacking with electrically connection notably absent a bump structure as found in the prior art.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a carrier having a die attach area;
   forming a plurality of recesses partially through the carrier outside the die attach area;
   conformally applying a first conductive layer over a surface of the carrier and into the recesses;
   disposing a semiconductor die over the die attach area of the carrier;
   depositing an encapsulant over the carrier and semiconductor die, the encapsulant extending into the recesses over the first conductive layer to form encapsulant bumps;
   removing the carrier from a surface of the first conductive layer over the encapsulant bumps;
   forming a second conductive layer from the surface of the first conductive layer to contact pads on the semiconductor die; and
   forming a first insulating layer over the second conductive layer and semiconductor die.

2. The method of claim 1, further including:
   forming a second insulating layer over the semiconductor die prior to disposing the semiconductor die over the carrier; and
   forming an opening through the second insulating layer over the contact pads of the semiconductor die prior to forming the second conductive layer.

3. The method of claim 1, further including:
   forming an adhesive layer over the semiconductor die prior to disposing the semiconductor die over the carrier; and
   forming an opening through the adhesive layer over the contact pads of the semiconductor die prior to forming the second conductive layer.

4. The method of claim 1, further including:
   providing a substrate with conductive traces; and
   disposing the semiconductor device over the substrate with the first conductive layer over the encapsulant bumps contacting the conductive traces, the first conductive layer over encapsulant bumps providing physical separation between the semiconductor die and substrate.

5. The method of claim 1, further including:
   forming a plurality of conductive vias through the encapsulant electrically connected to the first conductive layer;
   forming a third conductive layer over a surface of the encapsulant opposite encapsulant bumps; and
   stacking a plurality of the semiconductor devices electrically connected through the first conductive layer, second conductive layer, third conductive layer, and conductive vias, the first conductive layer over encapsulant bumps providing physical separation between the stacked semiconductor devices.

6. The method of claim 1, wherein the recesses extend more than halfway through the carrier.

7. A method of making a semiconductor device, comprising:
   providing a carrier;
   forming a plurality of recesses partially through the carrier;
   forming a first conductive layer over a surface of the carrier and into the recesses;
   mounting a semiconductor die to the carrier;
   depositing an encapsulant over the carrier and semiconductor die, the encapsulant extending into the recesses over the first conductive layer;
   forming a plurality of conductive vias through the encapsulant electrically connected to the first conductive layer;
   removing the carrier to expose the first conductive layer; and
   forming a second conductive layer between the first conductive layer and contact pads on the semiconductor die.

8. The method of claim 7, further including forming an insulating layer over the second conductive layer and semiconductor die.

9. The method of claim 7, further including:
forming an insulating layer over the semiconductor die prior to disposing the semiconductor die over the carrier; and
disposing the insulating layer into the recesses under the semiconductor die when disposing the semiconductor die over the carrier.

10. The method of claim 7, further including stacking a plurality of the semiconductor devices electrically connected through the first conductive layer, second conductive layer, and conductive vias, the first conductive layer providing physical separation between the stacked semiconductor devices.

11. The method of claim 7, further including:
providing a substrate with conductive traces; and
mounting the semiconductor device to the substrate with the first conductive layer contacting the conductive traces, the first conductive layer providing physical separation between the semiconductor die and substrate.

12. The method of claim 7, wherein the recesses extend more than halfway through the carrier.

13. A method of making a semiconductor device, comprising:
providing a semiconductor die;
depositing an encapsulant over the semiconductor die, the encapsulant including encapsulant bumps offset with respect to a surface of the semiconductor die;
forming a first insulating layer over the encapsulant bumps and semiconductor die; and
forming a first conductive layer over the first insulating layer over the encapsulant bumps and extending through the first insulating layer to the semiconductor die.

14. The method of claim 13, further including:
providing a carrier;
forming a plurality of recesses partially through the carrier;
forming the first conductive layer over a surface of the carrier and into the recesses;
disposing the semiconductor die over the carrier;
depositing the encapsulant over the carrier and semiconductor die, the encapsulant extending into the recesses over the first conductive layer;
removing the carrier to expose the first conductive layer; and
forming a second conductive layer between the first conductive layer and contact pads on the semiconductor die.

15. The method of claim 14, further including:
forming a second insulating layer over the semiconductor die prior to disposing the semiconductor die over the carrier; and
disposing the second insulating layer into the recesses under the semiconductor die when disposing the semiconductor die over the carrier.

16. The method of claim 14, further including forming an adhesive layer over the semiconductor die prior to disposing the semiconductor die over the carrier.

17. The method of claim 13, further including:
forming a second conductive layer between the first conductive layer and contact pads on the semiconductor die; and
forming a second insulating layer over the second conductive layer and semiconductor die.

18. The method of claim 13, further including:
providing a carrier;
forming a second insulating layer over the carrier;
forming a plurality of recesses partially through the second insulating layer;
disposing the semiconductor die over the second insulating layer;
depositing the encapsulant over the second insulating layer and semiconductor die, the encapsulant extending into the recesses of the second insulating layer to form encapsulant bumps;
removing the carrier to expose the encapsulant bumps; and
forming the first conductive layer over the encapsulant bumps.

19. The method of claim 13, further including:
providing a substrate with conductive traces; and
mounting the semiconductor device to the substrate with the first conductive layer over the encapsulant bumps contacting the conductive traces, the first conductive layer over encapsulant bumps providing physical separation between the semiconductor die and substrate.

20. A method of making a semiconductor device, comprising:
providing a semiconductor die including a contact pad;
depositing an encapsulant over the semiconductor die to cover the semiconductor die and form encapsulant bumps;
forming a first insulating layer over the semiconductor die; and
forming a first conductive layer on the encapsulant bumps and extending through the first insulating layer to the contact pad.

21. The method of claim 20, further including:
providing a carrier;
forming a plurality of recesses partially through the carrier;
forming the first conductive layer over a surface of the carrier and into the recesses;
disposing the semiconductor die over the carrier;
depositing the encapsulant over the carrier and semiconductor die, the encapsulant extending into the recesses over the first conductive layer;
removing the carrier to expose the first conductive layer; and
forming a second conductive layer between the first conductive layer and contact pads on the semiconductor die.

22. The method of claim 21, further including:
forming a second insulating layer over the semiconductor die prior to disposing the semiconductor die over the carrier; and
disposing the insulating layer into the recesses under the semiconductor die when disposing the semiconductor die over the carrier.

23. The method of claim 21, further including forming an adhesive layer over the semiconductor die prior to disposing the semiconductor die over the carrier.

24. The method of claim 20, further including:
forming a second conductive layer between the first conductive layer and contact pads on the semiconductor die; and
forming a second insulating layer over the second conductive layer and semiconductor die.

* * * * *